US010168187B2

(12) United States Patent
Schulz

(10) Patent No.: US 10,168,187 B2
(45) Date of Patent: Jan. 1, 2019

(54) EVALUATION CIRCUIT FOR A CAPACITIVE SENSOR, CAPACITIVE SENSOR, AND ACTUATOR IN A MOTOR VEHICLE

(71) Applicant: IFM ELECTRONIC GMBH, Essen (DE)

(72) Inventor: Jörg Schulz, Tettnang (DE)

(73) Assignee: IFM ELECTRONIC GMBH, Essen (DE)

( * ) Notice: Subject to any disclaimer, the term of this patent is extended or adjusted under 35 U.S.C. 154(b) by 0 days.

(21) Appl. No.: 15/535,201

(22) PCT Filed: Sep. 14, 2016

(86) PCT No.: PCT/EP2016/071609
§ 371 (c)(1),
(2) Date: Jun. 12, 2017

(87) PCT Pub. No.: WO2017/046111
PCT Pub. Date: Mar. 23, 2017

(65) Prior Publication Data
US 2018/0202838 A1    Jul. 19, 2018

(30) Foreign Application Priority Data
Sep. 15, 2015 (DE) .......................... 10 2015 217 575

(51) Int. Cl.
*G01D 5/24* (2006.01)
*G01R 27/26* (2006.01)
*H03K 17/955* (2006.01)
(52) U.S. Cl.
CPC ........... *G01D 5/24* (2013.01); *G01R 27/2605* (2013.01); *H03K 17/955* (2013.01); *H03K 2217/960745* (2013.01)

(58) Field of Classification Search
CPC ......................................... H03K 2217/960745
See application file for complete search history.

(56) References Cited

U.S. PATENT DOCUMENTS

| | | | | |
|---|---|---|---|---|
| 3,740,586 A | * | 6/1973 | Banks ....................... | G01F 1/80 327/31 |
| 2008/0252474 A1 | * | 10/2008 | Nakamura ........... | H03K 17/955 340/657 |
| 2010/0059349 A1 | * | 3/2010 | Wuestenbecker .... | H03K 17/962 200/314 |

FOREIGN PATENT DOCUMENTS

| | | |
|---|---|---|
| AT | 403213 | 12/1997 |
| DE | 102012106526 | 1/2014 |

(Continued)

OTHER PUBLICATIONS

International Search Report, International Application No. PCT/EP2016/071609, pp. 1-6, International Filing Date Sep. 14, 2016, mailing date of search report dated Nov. 30, 2016.

*Primary Examiner* — Clayton E LaBalle
*Assistant Examiner* — Jas Sanghera
(74) *Attorney, Agent, or Firm* — Bond Schoeneck & King, PLLC; George McGuire

(57) ABSTRACT

The present invention relates to an evaluation circuit for a capacitive sensor for detecting the distance, speed or position of an object, comprising a reference capacitance and two measuring capacitances, wherein the reference capacitance and the measuring capacitances are supplied with a square-wave voltage via a resistor, and wherein by use of a logic unit a time variable pulse is obtained the duration of which is a measure for the respective measuring capacitance.

9 Claims, 3 Drawing Sheets

(56) References Cited

FOREIGN PATENT DOCUMENTS

| | | |
|---|---|---|
| DE | 102012224007 | 6/2014 |
| DE | 102014216998 | 3/2016 |
| EP | 1860776 | 11/2007 |
| EP | 2568605 | 3/2013 |
| WO | 2007025785 | 3/2007 |
| WO | 2014012763 | 1/2014 |

* cited by examiner

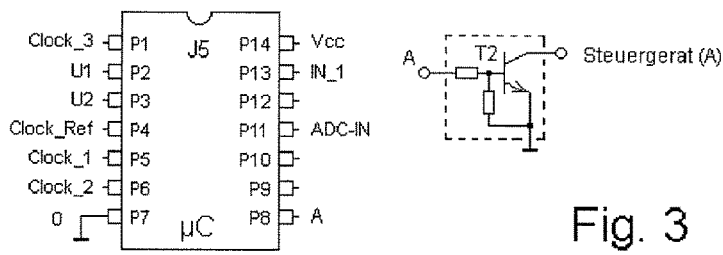
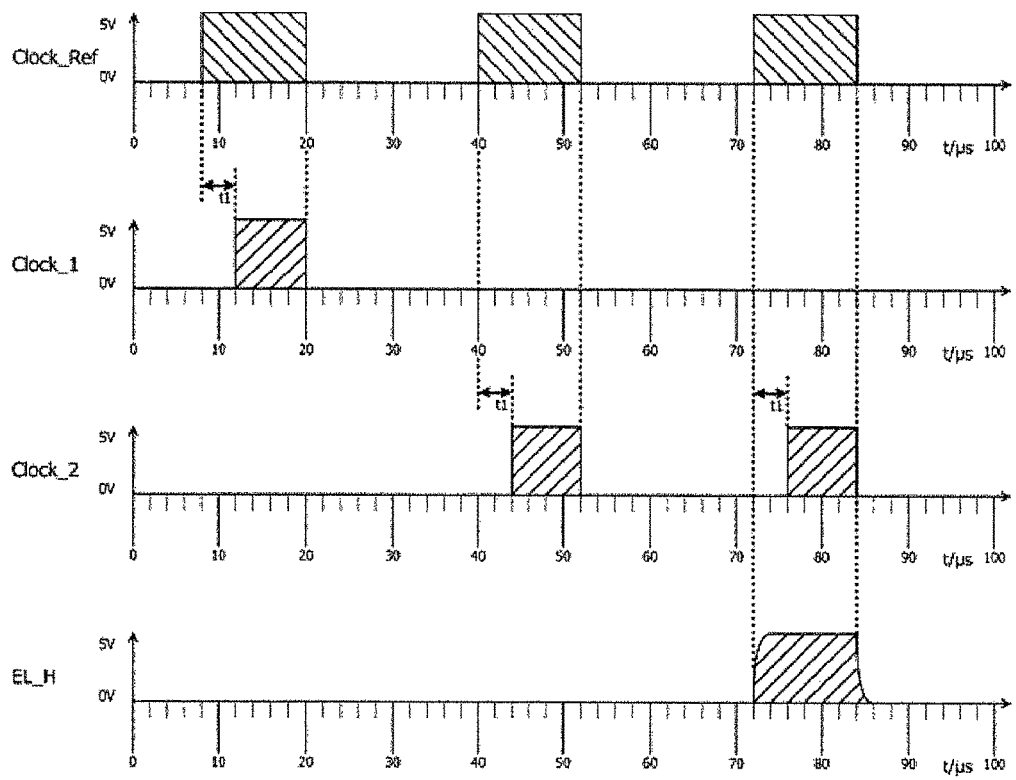
Fig. 3
Fig. 4

US 10,168,187 B2

EVALUATION CIRCUIT FOR A CAPACITIVE SENSOR, CAPACITIVE SENSOR, AND ACTUATOR IN A MOTOR VEHICLE

CROSS-REFERENCE TO RELATED APPLICATIONS

This application is the U.S. National Stage filing under 35 U.S.C. 371 of international application number PCT/EP2016/071609 filed on Oct. 14, 2016, which in turn claims priority to German Application No. 102015217575.8, filed Sep. 15, 2015, the entire disclosure of each of which is incorporated herein by reference.

The invention relates to an evaluation circuit for a capacitive sensor according to the preamble of claim 1.

Capacitive sensors are widespread not only in automation technology, but more recently also in the automotive industry, where they find application, inter alia, as a trunk or door opening or seat occupancy recognition.

AT 403 213 B discloses a capacitive moisture sensor comprising a square wave generator, the signal of which is fed to an AND gate via two different signal paths, wherein one signal path extends directly and the other includes a measuring electrode, the capacitance of which affects the signal waveform and thus delays the reaching of a switching threshold.

WO 2007 025 785 A1 discloses a capacitive sensor comprising a square wave generator, the signal of which is fed to a XOR gate via two different signal paths, wherein one signal path includes a measuring electrode and the other a reference electrode.

DE 10 2012 106 526 A1 discloses a capacitive door handle sensor for a motor vehicle comprising at least two electrodes with different monitoring regions, wherein one electrode acts as a reference electrode.

DE 10 2012 224 007 A1 discloses an arrangement and a method for determining the capacity of a measuring capacitor by conversion into a voltage which is detectable by an analog-digital converter comprising a charge transfer device for transferring the charge of an unknown capacitance $C_x$ to a measuring capacitor $C_L$, wherein, however, only the comparison of a single unknown capacitance $C_x$ with a reference capacitance $C_{ref}$ is provided.

DE 10 201 416 998 A1 shows an evaluation circuit for a capacitive sensor including a plurality of measuring capacitances and a reference capacitance, wherein the measuring capacitances are compared successively in a predetermined time regime with the same reference capacitance. It is the object of the invention to provide a circuit which is more cost efficient with respect to the circuit described in DE 10 201 416 998 A1 and which at the same time comprises additional capabilities for detecting the capacitively effective environmental influences.

The object of the invention is achieved with the characterizing features of claim 1. The dependent claims relate to the advantageous embodiment of the invention.

The essential idea of the invention is to compare the measuring capacitances successively in a predetermined time regime with the same reference capacitance and to controllably influence the respective capacitance measurement by means of an additional auxiliary electrode. To this end, the reference capacitance is connected to the input of a first switching stage and the measuring capacitances are connected to the inputs of further switching stages, wherein these switching stages, for example, are configured as NAND gates and form in combination a logic unit, which is configured such that the switching time of the first switching stage determines the switch-on time of an output signal and the switching time of a further switching stage determines the switch-off time of the output signal or such that the switching time of the first switching stage determines the switch-off time of an output signal and the switching time of a further switching stage determines the switch-on time of the output signal. The output signals of the logic unit are supplied to the input of an integration stage. Via the output of the integration stage which also may serve as a current source a charging capacitor is charged. The temporal length of the output pulses generated by the abovementioned logic unit determines the voltage of the charging capacitor.

In an advantageous embodiment the reference capacitance is connected to a time influencing unit which comprises at least one capacitor and a voltage source or is connected to a controllable voltage source. The time influencing unit is used to selectively influence the delay time generated by the reference capacitance.

The advantage of the invention is that by means of an auxiliary electrode which is supplied with a voltage signal substantially simultaneously with one of the measuring electrodes a selective capacitive influence of the measuring electrode is possible so that in this way further spatial regions in the vicinity of the measuring electrode can be capacitively evaluated without the need for a separate measuring channel with additional circuit complexity for the capacitance measurement of an electrode.

Sensor electrodes can be constructed which on the one hand results in a saving of components and on the other hand offers additional capabilities for the detection of capacitively effective environmental influences.

The invention is explained in more detail with reference to the drawings.

BRIEF DESCRIPTION OF THE DRAWINGS

FIG. 3 shows a microcontroller (μC) associated to the circuits in FIGS. 1 and 2 and comprising a switching stage;

FIG. 4 shows the pulse diagram for controlling the measurement in detail;

DETAILED DESCRIPTION

Figure 1:
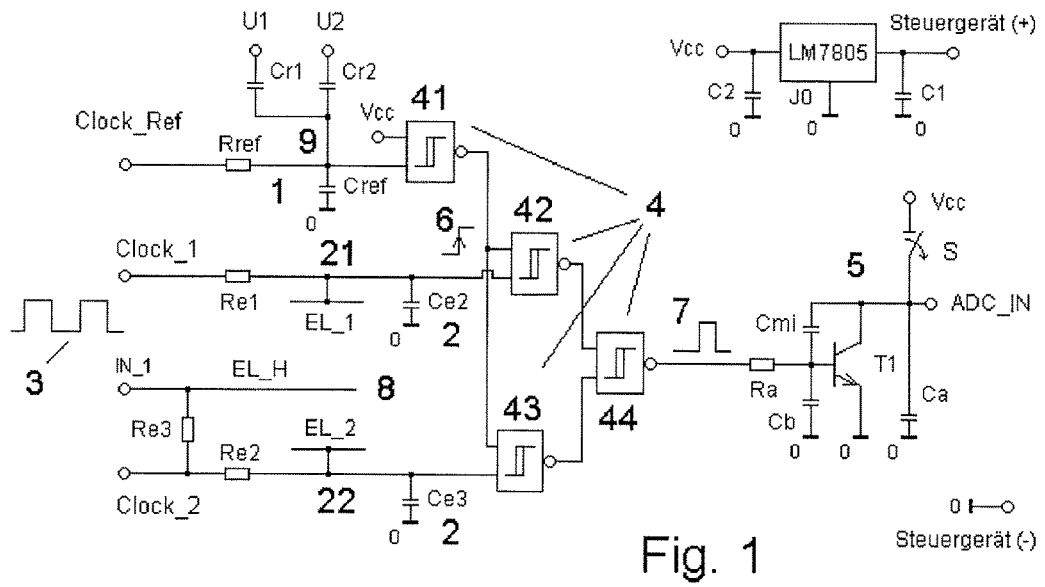
FIG. 1 shows an evaluation circuit according to the invention comprising a passive auxiliary electrode.

FIG. 1 shows an exemplary embodiment comprising an integrated circuit of the type 74HC132 with four switching stages (NAND gates) 41, 42, 43, 44 which form a logic unit 4, wherein in the rest state the controllable gate input of the switching stage indicated by 41 is at the logic state "High" such that its output and thus also the control signal 6 assume the logic state "Low". This has the consequence that for the duration of this state the switching stages 42, 43, 44 have their inputs which are not controllable from the outside set at the logic state "Low", too, and thus are signally locked, such that their outputs are at the logic state "High" for the duration of this signal state, the switching stage 44 is at the state "Low" at its output and the integration stage 5 is also locked, wherein the charging capacitor, indicated by reference symbol Ca which previously has been charged via the switch S which in turn is controlled by the microcontroller μC shown in FIG. 3, remains charged. The control input of the switching stage 41 which is not connected to the operating voltage is connected to a time influencing unit 9 which in addition to $R_{ref}$ and $C_{ref}$ comprises two capacitors $C_{r1}$ and $C_{r2}$ to which auxiliary voltage sources $U_1$ and $U_2$ are connected.

In the rest state the clock input Clock_Ref and one of the clock inputs Clock_1, Clock_2 are at "High". In the present example it is assumed that the clock input Clock_1 is presently at "High". The respective other clock input is at "Low". In this example the switching stage 42 whose clock input is at "High" is prepared for pulse generation while the other clock input, in this example the switching stage 43, remains locked by the logic input signal "Low".

In order to generate a pulse at one of the outputs of the switching stages 42, 43 and thus also at the switching stage 44 by means of an externally connected control unit J5 shown in FIG. 3, e.g. a microcontroller (μC), both the clock input "Clock_Ref" and the clock input of the clock inputs Clock_1, Clock_2 set at "High" are simultaneously switched to "Low". Thus, the signal applied to "Clock_Ref" is supplied via the low pass $R_{ref}$, $C_{ref}$ to the input of the switching stage 41 and triggers a positive voltage jump at its output when reaching the threshold voltage, wherein the delay time of this voltage jump is influenced by the time influencing unit 9 by means of which the signal at $C_{ref}$ can be shifted in time. To this end, the auxiliary voltages $U_1$ and $U_2$ are applied. These voltages and also the three clock signals (Clock_Ref, Clock_1, Clock_2) shown in FIG. 4 may be generated by means of the control unit (μC) described above.

For a reasonable pulse generation all time constants and all control signals which signally lie before the gate inputs of the gates 41 and 42, 43 are dimensioned or set such that at first the voltage at the gate input of gate 41 reaches the negative switching threshold. This causes the logic states at all gate inputs of the gates 42, 43 which are inaccessible from the outside to change from "Low" to "High", such that, as shown, the gate 42 having its input which is accessible from the outside set to the logic state "High" switches its output to "Low" and thus triggers the integration stage 5 connected downstream via the downstream connected logic element (NAND gate) 44. Thus, a discharging operation of the capacitor designated by Ca is started via the integration stage 5. Thus, the switch-on time of this output signal is determined by the switching time of the first switching stage 41. The other gate 43 the input of which which is accessible from the outside continues to be "Low" and, thus, remains signally locked.

Thereafter, the voltage at the gate input accessible from the outside whose clock input is switched from "High" to "Low" simultaneously with the signal "Clock_Ref" reaches its negative switching threshold such that the gate output of the switching stage 42 which has just been switched from "High" to "Low" is again switched back to "High", the gate 44 switches back to "Low" and thus the triggering of the integration stage 5 connected downstream is again interrupted such that the discharging operation of the capacitor designated by Ca is terminated. Thus, the switch-off time of this output signal is determined by the switching time of the further switching stage 42.

Thus, upon reaching the threshold voltage of a first switching stage 41 a start signal and upon reaching the threshold voltage of a further switching stage 42 or 43 a stop signal is generated.

The time influencing unit 9 includes for the purpose of influencing the delay time generated by the reference capacitance 1 ($C_{ref}$) at least one capacitor $C_{r1}$ and a voltage source $U_1$ controllable by the evaluation unit μC.

Thus, the time duration with which the integration stage 5 is controlled depends on the electrode capacitance which is associated to the respective activated clock input (Clock_1, Clock_2). For the evaluation of any capacity to be measured the respective associated clock input is controlled in the manner described above.

The auxiliary electrode 8 with the designation EL_H is located at a further terminal IN_1 of the control unit μC of FIG. 3, is fed via a resistor Re3 from at least one of the clock inputs Clock_1, Clock_2, and is capacitive coupled to at least one of the measuring electrodes 21, 22 (EL_1, EL_2). In the example shown the auxiliary electrode 8 is fed from the clock input Clock_2 and is capacitively coupled to the measuring electrode 22 (EL_2).

The terminal IN_1 can be operated in at least 2 different modes during the pulse generation of Clock_2, for example high-ohmic and low-ohmic. Thus, in the high-ohmic mode the clock signal provided at Clock_2 is also supplied to the auxiliary electrode 8 (EL_H), while in the low-ohmic mode the clock signal provided at Clock_2 is short-circuited by IN_1 and thus does not appear at the auxiliary electrode 8 (EL_H). Thus, in the two different modes the capacitance measurement at 22 (EL_2) is differently influenced by the capacitive coupling between the electrodes 8 (EL_H) and 22 (EL_2) which in the signal evaluation allows a statement concerning the mutual capacitance between the electrodes 8 (EL_H) and 22 (EL_2).

This may, for example, be useful in order to recognize the influence of objects disposed outside the sensor assembly such as water, conductive primer or a chrome coating on the housing of the device and thus to optimize the detection characteristic of the sensor for example through adapted parameterization. In this way, moreover, unwanted operating conditions can be suppressed or the influence of variable mounting environments can be recognized.

Figure 2:
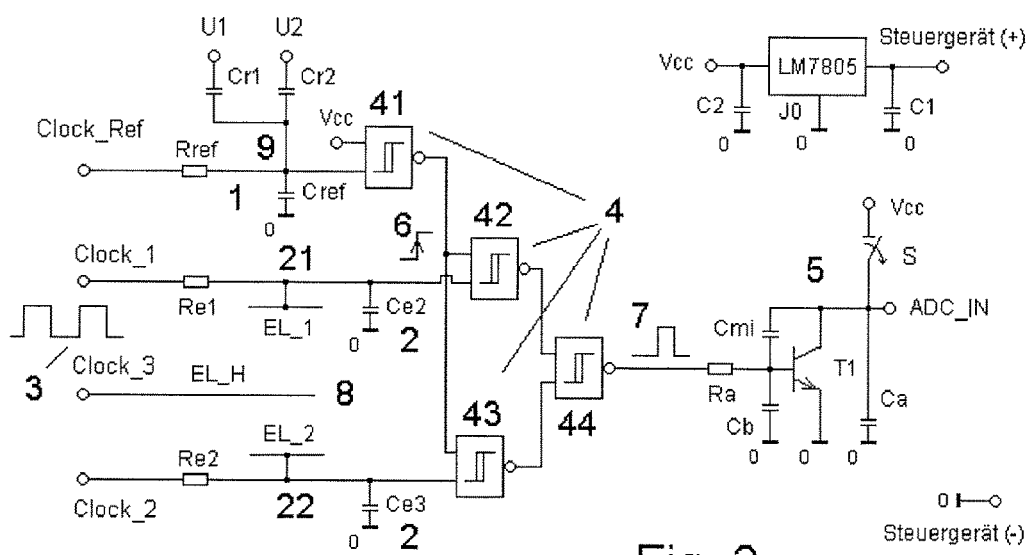
FIG. 2 shows an evaluation circuit according to the invention comprising an active auxiliary electrode.

FIG. 2 shows a circuit arrangement similar to FIG. 1 with the only difference in the control of the auxiliary electrode 8 (EL_H). In this exemplary embodiment the auxiliary electrode 8 (EL_H) is fed by an additional clock input Clock_3. The exemplary embodiment of FIG. 2 offers the additional possibility to correlate the control signal at Clock_3 both with the measurement at 21 (EL_1) and the measurement at 22 (EL_2) and thus to evaluate both mutual capacities. If Clock_3 is generated simultaneously with Clock_1 the capacitance between the electrodes 8 (EL_H) and 21 (EL_1) is influenced. If, on the other hand, Clock_3 is generated simultaneously with Clock_2, the capacitance between the electrodes 8 (EL_H) and 22 (EL_2) is influenced. Furthermore, the control signal for Clock_3 can be generated both in phase as well as anti-phase which allows for a double useful signal stroke. This exemplary embodiment requires a further terminal of the microcontroller μC, which allows this operating mode. Depending on the type of the microcontroller μC (J5 of FIG. 3), the variant of FIG. 1 or the variant of FIG. 2 can be preferred.

FIG. 3 shows a microcontroller for the control and evaluation of the circuits shown in the above two figures. For FIG. 1 the terminal P1 (Clock_3) is not required and can remain non-connected. The same applies to FIG. 2 and the terminal P13 (IN_1). The terminal P8 (A) is connected to a switching stage (T2) which, for example, may transmit a switching signal or a bus signal, in order to transmit the desired measurement results or evaluation criteria by use of the switching stage T2 to an external control unit.

FIG. 4 shows an exemplary associated pulse diagram in detail. The signals correspond to the clocks of FIG. 1. Here, the clock signal (Clock_Ref) intended for gate 41, the clock signal (Clock_1) intended for gate 42, the clock signal (Clock_2) intended for gate 43 and the signal voltage applied to the auxiliary electrode 8 (EL_H) are depicted. This signal voltage is evaluated in the signal pattern shown in co-operation with clock signal (Clock_2) which triggers the electrode 22 (EL_2). Two different modes are shown, wherein in one mode the clock signal Clock_Ref is generated simultaneously with the clock signal Clock_2. In the diagram this is the time 52 µs. In the other mode which generates a further clock signal at the time 84 µs an additional signal edge is visible at EL_H, whereby an influence of the mutual capacity between EL_2 and EL_H is achieved. The time period designated with "t1" is used to establish a defined initial state and must be at least as large as the sum of all delay times that may influence the electrical potential of the relevant capacities, and thus provides for a reproducible sequence of measurement.

Figure 5:
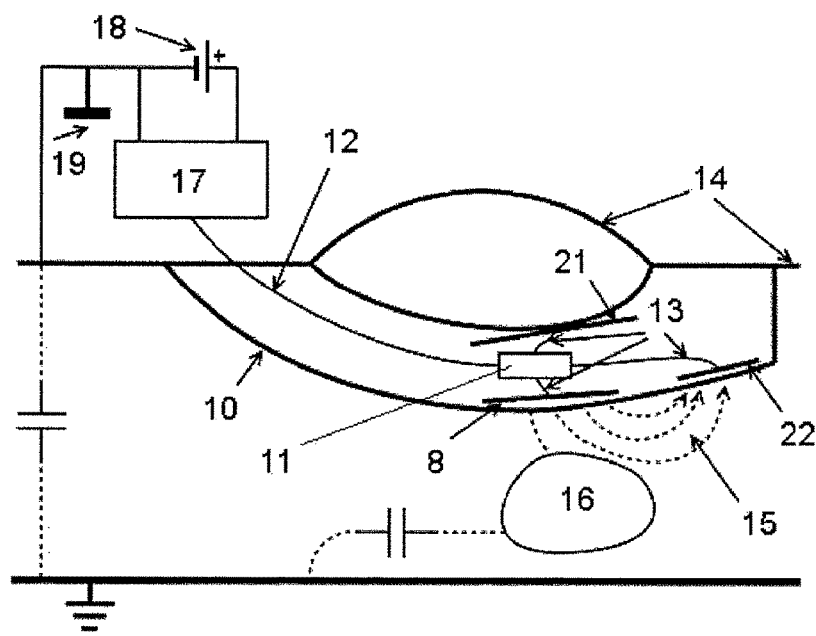
FIG. 5 shows the embodiment of the circuit according to the invention in a vehicle door handle.

FIG. 5 shows a constructive exemplary embodiment in the door handle of a motor vehicle, wherein the principle of operation of the auxiliary electrode 8 and the influence of the mutual capacitive coupling (electric field 15) between the auxiliary electrode 8 and the electrode 22 are shown which is influenced by an approaching influencing object 16. In this case, the constructive sensor assembly comprises the electronics 11 including the electrode system 8, 13, 22, housing 10 and other structurally related elements which also influence the mutual capacitive coupling between the auxiliary electrode and a further electrode. The assembly, however, is sensorial usable, i.e. in the sense of a recognition of certain modes of operation or influencing factors, e.g. water or unwanted modes of operations, only if at least a part of the capacitive coupling 15 extends outside this constructive sensor assembly such that it can be influenced by external objects 16.

Figure 6:
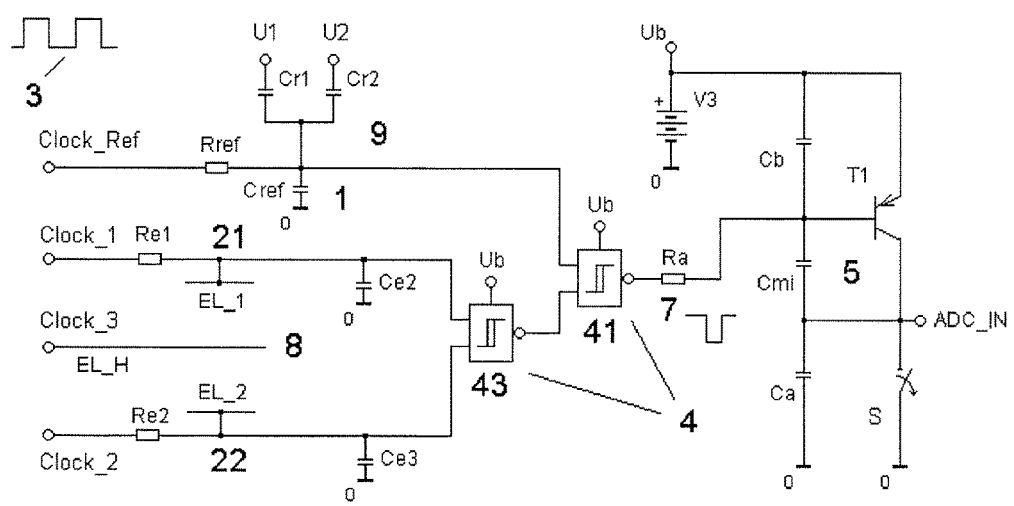
FIG. 6 shows a circuit comprising two sensor electrodes and an active auxiliary electrode.

FIG. 6 describes a particularly simple battery operated exemplary embodiment in which the logic unit 4 consists of only two NAND gates 41, 43. At the input of the first switching stage 41 the reference capacitance 1 is disposed. The function of the further switching stages at the inputs of which the electrodes 21, 22 are connected, is here adopted by the gate 43. The circuit includes two sensor electrodes 21, 22 and an auxiliary electrode 8 which is actively supplied with an auxiliary signal (Clock_3). This circuit operates in reverse sequence of events with respect to the circuits of FIG. 1 or FIG. 2 so that in this arrangement the switch-on time of the output signal 7 of the logic unit 4 is not determined by the switching time of the first switching stage 41 but by the switching times of the further switching stages 43. The switch-off time of the output signal 7 of the logic unit 41 is not determined by the switching time of a further switching stage 43 but vice versa from the switching time of the first switching stage 41. In addition, the charging capacitor Ca is not discharged at the output of the integrator means 5 but charged.

LIST OF REFERENCE SYMBOLS

1 Reference capacitance, $C_{ref}$
2 Measuring capacitance (capacitances) Ce2, Ce3, measuring electrode(s)⇒21 and 22
3 Square-wave voltage, clock signal
4 Logic unit with the switching stages (41, 42, 43, 44)⇒NAND Gate 74HC132 with Schmitt trigger
5 Integration stage (bipolar Miller integrator or current source) with transistor T1 and output capacitor Ca
6 Control signal for the inputs of the gates 42 and 43 which are not accessible from the outside
7 Output signal of the logical unit
8 Auxiliary capacitance, auxiliary electrode
9 Time influencing unit
10 Door outer handle housing
11 Capacitive sensor electronics
12 Feed and data line
13 Electrode line
14 Vehicle body
15 Electrical field, capacitive coupling
16 Object, influencing object
17 External control unit
18 Power supply, battery
19 Electrical vehicle ground
20 Ground potential
21 First measuring electrode
22 Second measuring electrode

The invention claimed is:

1. Evaluation circuit for a capacitive sensor for detecting a distance, a speed or a position of an object, comprising: a reference capacitance and two measuring capacitances, wherein the reference capacitance and the measuring capacitances are supplied with a square-wave voltage via a resistor and by means of a logic unit a time variable pulse is obtained the duration of which is a measure for the respective measuring capacitance, characterized in that the reference capacitance is connected to the input of a first switching stage and the measuring capacitances are connected to the inputs of further switching stages, wherein at least one of the measuring capacitance is capacitively coupled to an auxiliary electrode, wherein the switching stages are part of the logic unit which is designed so that the reaching of a threshold voltage of the first switching stage determines the switch-on time of an output signal and the reaching of a threshold voltage of a further switching stage determines the switch-off time of the output signal, and wherein the output of the logic unit is connected to the input of an integration stage, wherein a charging capacitor is charged or discharged via the output of the integration stage, wherein the capacitive coupling between the auxiliary electrode and at least one measuring electrode for the formation of at least one of the measuring capacitance is accomplished by an electric field extending outside a sensor assembly comprising the auxiliary and measuring electrodes, such that the capacitive coupling can be influenced by the object, which is structurally located outside the sensor assembly.

2. Evaluation circuit according to claim 1, characterized in that the reference capacitance is connected to a time influencing unit for selectively influencing the delay time generated by the reference capacitance, wherein the time influencing unit comprises at least one capacitor and a controllable voltage source.

3. Evaluation circuit according to claim 1, characterized in that the auxiliary electrode and at least one measuring electrode are spaced apart from each other to create the electric field extending outside the sensor assembly.

4. Capacitive sensor comprising: an evaluation circuit for detecting a distance, a speed or a position of an object, and comprising a reference capacitance and two measuring capacitances, wherein the reference capacitance and the measuring capacitances are supplied with a square-wave voltage via a resistor and by means of a logic unit a time variable pulse is obtained the duration of which is a measure for the respective measuring capacitance, characterized in that the reference capacitance is connected to the input of a first switching stage and the measuring capacitances are connected to the inputs of further switching stages, wherein at least one of the measuring capacitance is capacitively coupled to an auxiliary electrode, wherein the switching stages are part of the logic unit which is designed so that the reaching of a threshold voltage of the first switching stage determines the switch-on time of an output signal and the reaching of a threshold voltage of a further switching stage determines the switch-off time of the output signal, and wherein the output of the logic unit is connected to the input of an integration stage, wherein a charging capacitor is charged or discharged via the output of the integration stage, wherein the capacitive coupling between the auxiliary electrode and at least one measuring electrode for the formation of at least one of the measuring capacitance is accomplished by an electric field extending outside a sensor assembly comprising the auxiliary and measuring electrodes, such that the capacitive coupling can be influenced by the object, which is structurally located outside the sensor assembly.

5. Actuator in a motor vehicle comprising: a capacitive sensor that comprises an evaluation circuit for detecting a distance, a speed or a position of an object, and comprising a reference capacitance and two measuring capacitances, wherein the reference capacitance and the measuring capacitances are supplied with a square-wave voltage via a resistor and by means of a logic unit a time variable pulse is obtained the duration of which is a measure for the respective measuring capacitance, characterized in that the reference capacitance is connected to the input of a first switching stage and the measuring capacitances are connected to the inputs of further switching stages, wherein at least one of the measuring capacitance is capacitively coupled to an auxiliary electrode, wherein the switching stages are part of the logic unit which is designed so that the reaching of a threshold voltage of the first switching stage determines the switch-on time of an output signal and the reaching of a threshold voltage of a further switching stage determines the switch-off time of the output signal, and wherein the output of the logic unit is connected to the input of an integration stage, wherein a charging capacitor is charged or discharged via the output of the integration stage, wherein the capacitive coupling between the auxiliary electrode and at least one measuring electrode for the formation of at least one of the measuring capacitance is accomplished by an electric field extending outside a sensor assembly comprising the auxiliary and measuring electrodes, such that the capacitive coupling can be influenced by the object, which is structurally located outside the sensor assembly.

6. Evaluation circuit for a capacitive sensor for detecting a distance, a speed or a position of an object, comprising a reference capacitance and two measuring capacitances, wherein the reference capacitance and the measuring capacitances are supplied with a square-wave voltage via a resistor and by means of a logic unit a time variable pulse is obtained the duration of which is a measure for the respective measuring capacitance, wherein the reference capacitance is connected to the input of a first switching stage and the measuring capacitances are connected to the inputs of further switching stages, wherein at least one of the measuring capacitance is capacitively coupled to an auxiliary electrode, wherein the switching stages are part of the logic unit which is designed so that the reaching of a threshold voltage of the first switching stage determines the switch-on time of an output signal and the reaching of a threshold voltage of a further switching stage determines the switch-off time of the output signal, and wherein the output of the logic unit is connected to the input of an integration stage, wherein a charging capacitor is charged or discharged via the output of the integration stage, wherein the reference capacitance is connected to a time influencing unit for selectively influencing the delay time generated by the reference capacitance, wherein the time influencing unit comprises at least one capacitor and a controllable voltage source.

7. Evaluation circuit according to claim 6, characterized in that the capacitive coupling between the auxiliary electrode and the at least one measuring electrode can be influenced by the object, which is structurally located outside a sensor assembly.

8. Capacitive sensor comprising an evaluation circuit for a capacitive sensor for detecting a distance, a speed or a position of an object, comprising a reference capacitance and two measuring capacitances, wherein the reference capacitance and the measuring capacitances are supplied with a square-wave voltage via a resistor and by means of a logic unit a time variable pulse is obtained the duration of which is a measure for the respective measuring capacitance, wherein the reference capacitance is connected to the input of a first switching stage and the measuring capacitances are connected to the inputs of further switching stages, wherein at least one of the measuring capacitance is capacitively coupled to an auxiliary electrode, wherein the switching stages are part of the logic unit which is designed so that the reaching of a threshold voltage of the first switching stage determines the switch-on time of an output signal and the reaching of a threshold voltage of a further switching stage determines the switch-off time of the output signal, and wherein the output of the logic unit is connected to the input of an integration stage, wherein a charging capacitor is charged or discharged via the output of the integration stage, wherein the reference capacitance is connected to a time influencing unit for selectively influencing the delay time generated by the reference capacitance, wherein the time influencing unit comprises at least one capacitor and a controllable voltage source.

9. Actuator in a motor vehicle comprising a capacitive sensor comprising an evaluation circuit for a capacitive sensor for detecting a distance, a speed or a position of an object, comprising a reference capacitance and two measuring capacitances, wherein the reference capacitance and the measuring capacitances are supplied with a square-wave voltage via a resistor and by means of a logic unit a time variable pulse is obtained the duration of which is a measure for the respective measuring capacitance, wherein the reference capacitance is connected to the input of a first switching stage and the measuring capacitances are connected to the inputs of further switching stages, wherein at least one of the measuring capacitance is capacitively coupled to an auxiliary electrode, wherein the switching stages are part of the logic unit which is designed so that the reaching of a threshold voltage of the first switching stage determines the switch-on time of an output signal and the reaching of a threshold voltage of a further switching stage determines the switch-off time of the output signal, and wherein the output of the logic unit is connected to the input of an integration stage, wherein a charging capacitor is charged or discharged via the output of the integration stage, wherein the reference capacitance is connected to a time influencing unit for selectively influencing the delay time generated by the reference capacitance, wherein the time influencing unit comprises at least one capacitor and a controllable voltage source.

* * * * *